(12) United States Patent
Franck

(10) Patent No.: US 6,252,459 B1
(45) Date of Patent: Jun. 26, 2001

(54) SYSTEM AND METHOD FOR A DUAL BANDWIDTH CAPACITOR MULTIPLYING FILTER

(75) Inventor: Stephen J. Franck, Felton, CA (US)

(73) Assignee: Siemens Microelectronics, Inc., Iselin, NJ (US)

( * ) Notice: Subject to any disclaimer, the term of this patent is extended or adjusted under 35 U.S.C. 154(b) by 0 days.

(21) Appl. No.: 09/281,708

(22) Filed: Mar. 30, 1999

(51) Int. Cl.[7] ............................................. H03F 1/34
(52) U.S. Cl. .................................... 330/294; 330/109
(58) Field of Search ................................ 330/107, 109, 330/294, 302, 300; 327/553, 555

(56) References Cited

U.S. PATENT DOCUMENTS

| | | | |
|---|---|---|---|
| 5,218,319 | * 6/1993 | Takimoto | 330/294 |
| 5,396,194 | * 3/1995 | Williamson et al. | 330/297 |
| 5,497,111 | 3/1996 | Cunningham | 327/58 |
| 5,559,460 | 9/1996 | Cunningham | 327/179 |
| 5,701,314 | 12/1997 | Armstrong et al. | 371/40.3 |
| 5,705,950 | * 1/1998 | Butler | 330/293 |
| 5,708,376 | * 1/1998 | Ikeda | 330/294 |
| 5,715,110 | 2/1998 | Nishiyama et al. | 360/67 |
| 5,737,157 | 4/1998 | Gill | 360/113 |
| 5,793,207 | 8/1998 | Gill | 324/252 |
| 5,793,240 | 8/1998 | Kuwano et al. | 327/310 |
| 5,793,576 | 8/1998 | Gill | 360/113 |
| 5,818,656 | 10/1998 | Klaassen et al. | 360/67 |

* cited by examiner

Primary Examiner—Benny Lee
Assistant Examiner—Khanh Van Nguyen
(74) Attorney, Agent, or Firm—Fish & Richardson P.C.

(57) ABSTRACT

The present invention is related to a filter circuit that allows preamplifiers, such as those used in hard disk drives, to quickly recover from transients such transients caused by power switching, write to read switching, and thermal asperity. According to an embodiment of the present invention, under normal conditions, such as signals at 100 KHz to 10 MHz, signals at medium frequencies, such as signals at 100 KHz to 10 MHz, pass through a low pass filtering circuit. When a transient signal is received, then a change in voltage for $V_{out}$ of the low pass filtering circuit increases by more than $100*V_{out}$. For example, during transient conditions, the low pass filter circuit may also pass signals ranging from 10 MHz to 100 MHz. Accordingly, under transient conditions, the low pass pole moves approximately 100 times or more. A feedback loop subtracts the resulting low pass signals from the original signal, acting as a high pass filter. The overall circuit recovers quickly from the transient by adjusting for the tail end of the transient. Transient conditions may include a signal that is low frequency or higher amplitude or both. As the transient condition disappears, then the filter circuit resumes normal operation.

20 Claims, 4 Drawing Sheets

US 6,252,459 B1

SYSTEM AND METHOD FOR A DUAL BANDWIDTH CAPACITOR MULTIPLYING FILTER

FIELD OF THE INVENTION

The present invention relates to electronic circuits, in particular, the present invention relates to a circuit used in a preamplifier that allows fast recovery from electrical transients.

BACKGROUND OF THE INVENTION

Magnetic read head signal preamplifiers used in hard disk drives typically require fast recovery from electronic transients such as power switching, write to read switching, and thermal asperity. If the preamplifier is unable to recover quickly from transients, then performance of the hard disk drive may be compromised. Power switching occurs when the power is turned on or off. Write to read switching occurs when the disk drive changes functions from writing to the hard disk to reading from the hard disk. A transient such as thermal asperity occurs when a disk drive head hits the disk as the disk goes by. The contact with the disk causes heat on the disk drive head and this heat may show up as a voltage. A thermal asperity may generate a significant amount of energy and only a small fraction of that energy should be processed. These examples of electronic transients typically produce signals that are undesirable to process. If these electronic transients are processed, performance is typically reduced.

Fast recovery from electronic transients, such as power switching, write to read switching, and thermal asperity, is typically achieved via a complicated circuit performing complicated functions, such as dual peak detection and subtraction. Conventional preamplifier circuits that provide fast recovery from transients typically require a substantially large number of components. A large number of circuit devices potentially increase the risk of a device failure in addition to increasing the cost of the circuit.

It would be desirable to allow preamplifiers to quickly recover from electrical transients by integrating a simple circuit. The present invention addresses such a need.

SUMMARY OF THE INVENTION

The present invention is related to a filter circuit that allows preamplifiers, such as those used in hard disk drives, to quickly recover from transients such transients caused by power switching, write to read switching, and thermal asperity. According to an embodiment of the present invention, under normal conditions, such as signals at 100 KHz to 10 MHz, signals at medium frequencies, such as signals at 100 KHz to 10 MHz, pass through a low pass filtering circuit. When a transient signal is received, then a change in voltage for $V_{out}$ of the low pass filtering circuit increases by more than $100*V_{out}$. For example, during transient conditions, the low pass filter circuit may also pass signals ranging from 10 MHz to 100 MHz. Accordingly, under transient conditions, the low pass pole moves approximately 100 times or more. A feedback loop subtracts the resulting low pass signals from the original signal, acting as a high pass filter. The overall circuit recovers quickly from the transient by adjusting for the tail end of the transient. Transient conditions may include a signal that is low frequency or higher amplitude or both. As the transient condition disappears, then the filter circuit resumes normal operation.

A system according to an embodiment of the present invention of filtering a signal in a preamplifier is presented. The system comprising a filter that passes a first range of signals during a first input signal condition and passes a second range of signals during a second input signal condition, wherein the filter produces a first signal, and wherein the second input signal condition includes a transient. The system also includes a differential amplifier coupled to the filter, wherein the differential amplifier subtracts the first signal from a second signal.

A method according to an embodiment of the present invention for filtering a signal in a preamplifier is also presented. The method comprising providing a first signal and determining whether the signal is a transient signal. The method also filters the signal at a first range of frequencies if the signal is not a transient signal, resulting in a first filtered signal; and filters the signal at a second range of frequencies if the signal is a transient signal, resulting in a second filtered signal. One of the first filtered signal and the second filtered signal is subtracted from a second signal.

DETAILED DESCRIPTION OF THE PREFERRED EMBODIMENTS

The following description is presented to enable one of ordinary skill in the art to make and to use the invention and is provided in the context of a patent application and its requirements. Various modifications to the preferred embodiments will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
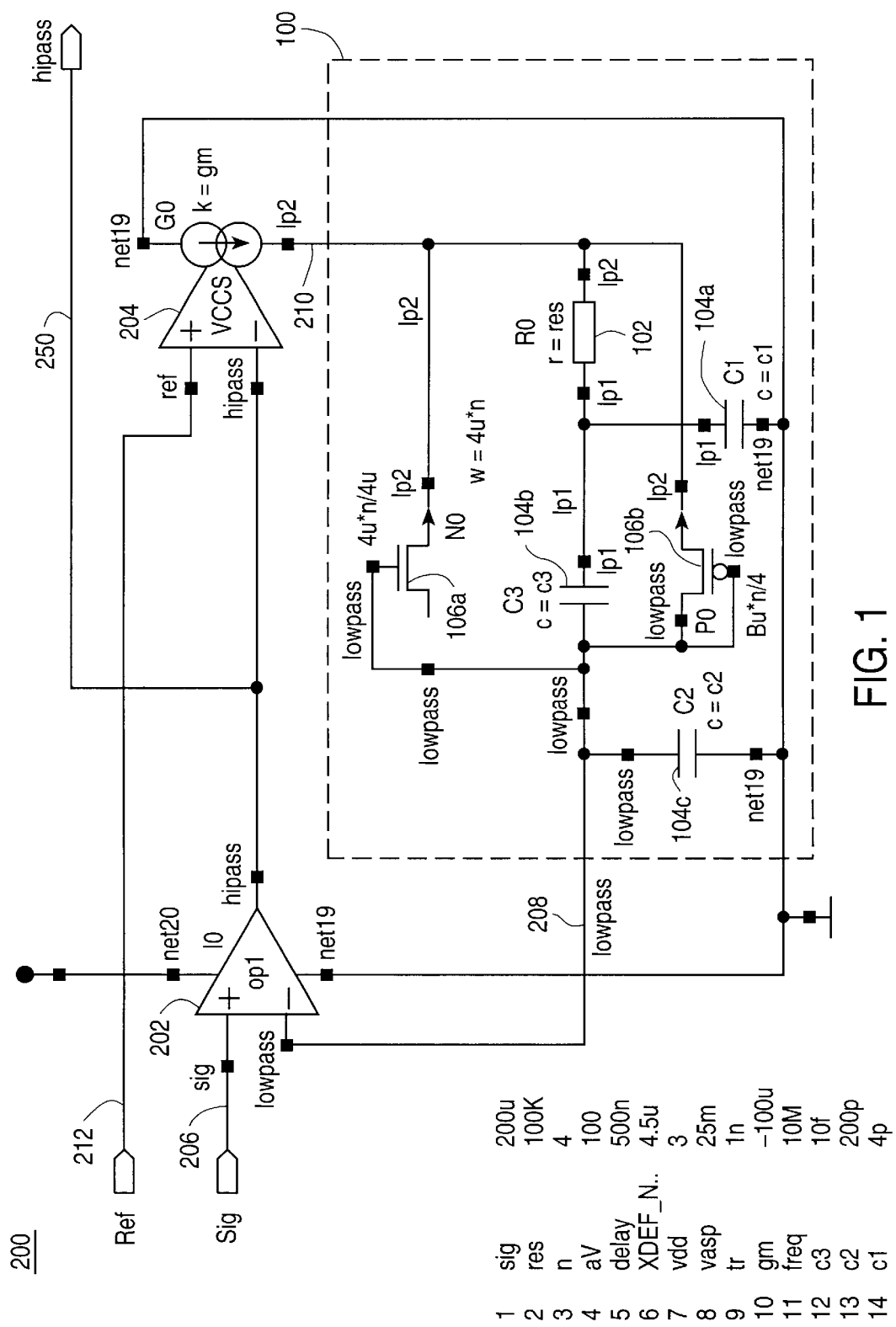
FIG. 1 is a schematic diagram of a filter circuit according to an embodiment of the present invention for allowing a preamplifier to quickly recover from a transient event.

FIG. 1 is a schematic diagram of a circuit according to an embodiment of the present invention for quickly recovering from transients. The circuit 200 is shown to include a differential amplifier 202, a transconductor 204, and a low pass filter circuit 100. The differential amplifier 202 receives a signal 206 and subtracts a low pass signal 208 produced by circuit 100 from the signal 206. When the low pass signal 208 is subtracted from the original signal 206, then the result is equivalent to a high pass filter. A high pass filter is a selective filter that transmits frequencies above a critical (cut-off) frequency and blocks frequencies below the cut-off value. The critical cut-off frequency is commonly referred to as a high pass pole. In the example shown in FIG. 1, the high pass pole is equivalent to the low pass pole of the low pass filter circuit 100. An example of a low pass pole of circuit 100 and a high pass pole of circuit 200 is approximately 100 KHz. As the name suggests, a low pass filter is a selective filter that transmits frequencies below a critical (cut-off) frequency and blocks frequencies above the cut-off value. The cut-off frequency is commonly referred to as a low pass pole.

The range of the resulting high pass signal depends on the range of signals passed by the low pass filter circuit 100. The high pass signal is then sent out via connection 250. For example, the high pass signal sent out through connection 250 may be the output of a preamplifier in a disk drive.

In addition to being sent out through connection 250, the high pass signal is also sent into the transconductor 204. The transconductor 204 outputs a current as a linear function of an input voltage. For example, the transconductor 204 may have a multiplier of −100 microAmps per volt. The transconductor 204 produces an $I_{in}$ of the low pass filter circuit 100. An example of the AC signal of $I_{in}$ under normal conditions is approximately 2 micro Amps at 10 MHz. The $I_{in}$ of circuit 100 flows into circuit 100 via connection 210. The $V_{out}$ of circuit 100 is sent out of circuit 100 and into the differential amplifier 202 via connection 208.

Under normal conditions, the circuit 100 acts as a low pass circuit that sends the resulting low pass signal through connection 208 and into a differential amplifier 202. For example, under normal conditions, the low pass circuit may send low pass signals ranging from 100 KHz to 10 MHz.

A transient, such as thermal asperity, may occur when a disk drive head hits the disk as the disk goes by. The contact with the disk causes heat on the disk drive head and this heat may show up as a voltage. A thermal asperity may generate a significant amount of energy and only a small fraction of that energy should be processed. Accordingly, a high pass filter may be used to subtract out the low frequencies of the thermal asperity signal.

Under normal conditions, the circuit 100 passes low pass signals such as 100 KHz to 10 MHZ and it is subtracted from the signal in the differential amplifier 202, thus producing a high pass result. For example, the high pass signal may be a signal ranging above 100 KHz to above 10 MHz, depending on the low pass signal produced by circuit 100. However, under non-normal conditions, i.e., during receipt of transient signals such as those caused by thermal asperity, the circuit 100 moves its low pass pole by a significant amount, such as more than 100 times the low pass pole during normal conditions. For example, during transient conditions, the low pass filter circuit 100 may also pass signals ranging from 10 MHz to 100 MHz. Accordingly, the high pass pole of the differential amplifier 202 is effectively moved by a significant amount, such as more than 100 times the high pass pole during normal conditions. When the high pass pole is moved, then the remainder of the transient is filtered out and the circuit 100 moves back into normal conditions.

Figure 2A:
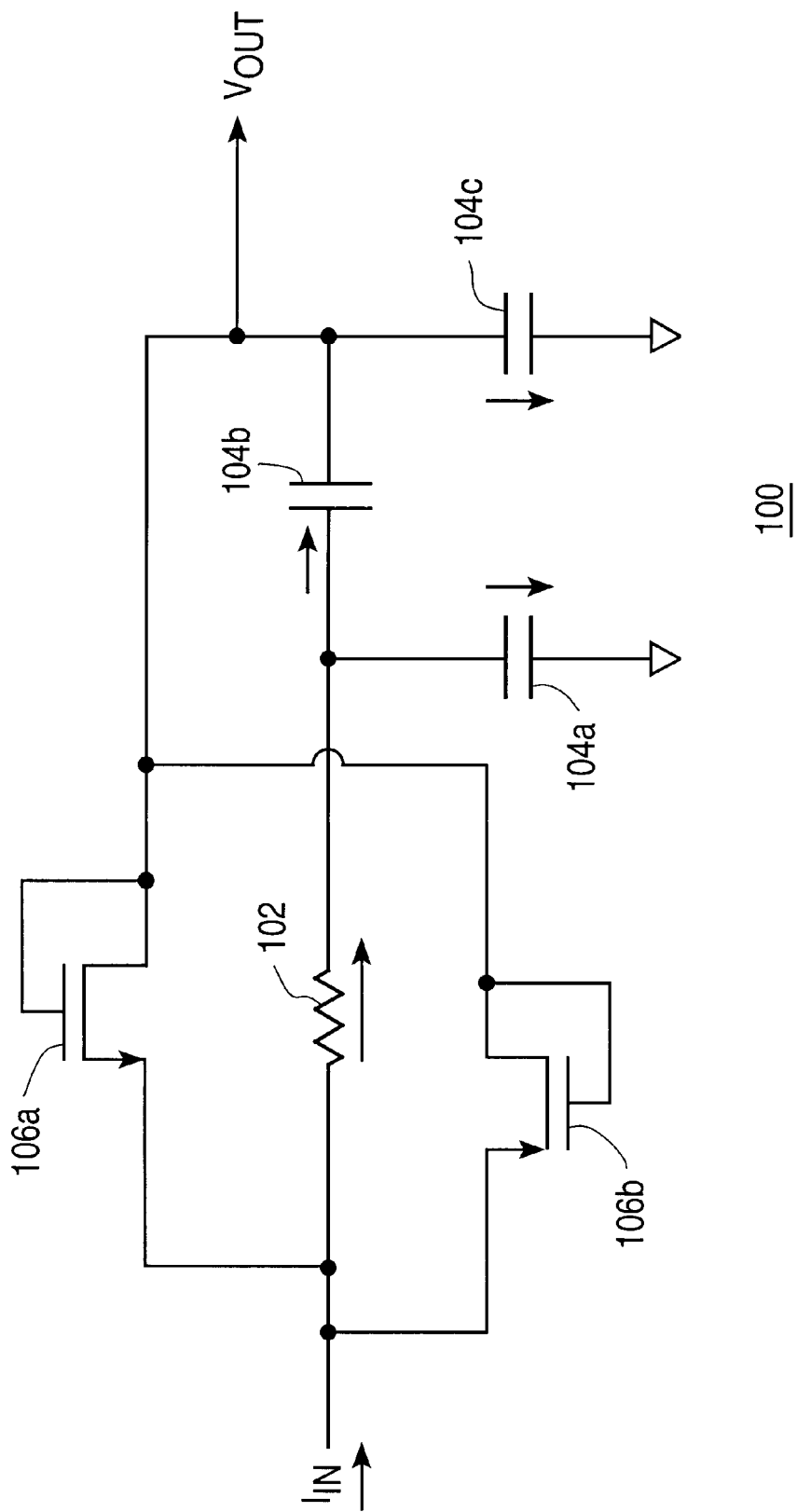
FIGS. 2A–2B is are schematic diagrams of a low pass filter circuit according to an embodiment of the present invention for allowing a preamplifier to quickly recover from a transient event.
Figure 2B:
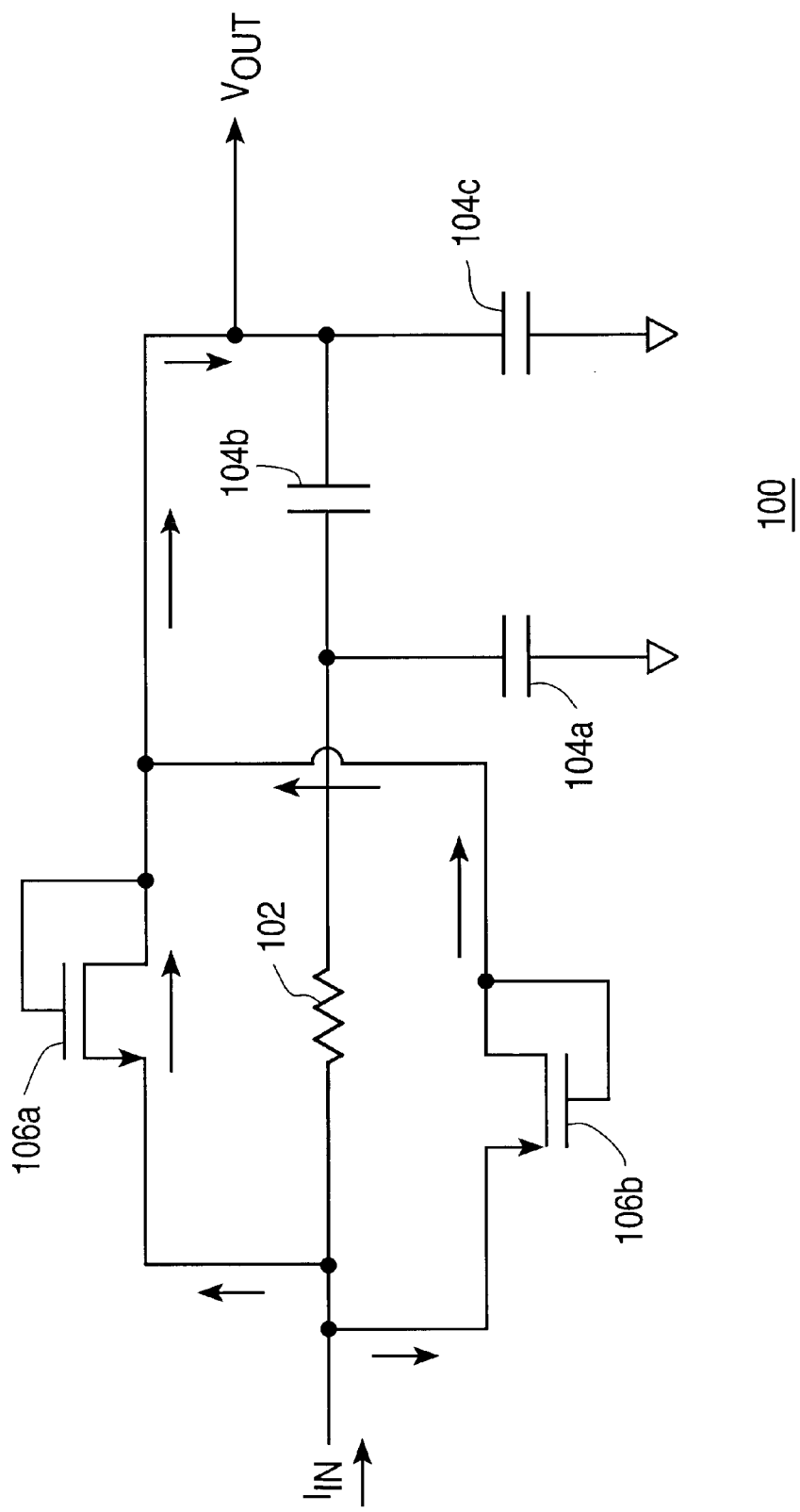

FIGS. 2A–2B are schematic diagrams of a low pass filter circuit, such as circuit 100 of FIG. 1, according to an embodiment of the present invention for filtering out unwanted low frequency signals and providing fast recovery from a transient, such as thermal asperity. The low pass filtering circuit 100 according to an embodiment of the present invention includes a resistor 102, transistors 106a–106b, and capacitors 104a–104c. An example of the type of transistor for transistor 106a is an NMOS transistor, and for transistor 106b is a PMOS transistor. An example of the threshold voltages of transistor 106a and 106b is approximately 0.4V. An example of the capacitance of capacitors 104a, 104b, and 104c are approximately $4\times10^{-12}$ farad, $10\times10^{-15}$ farad, and $200\times10^{-12}$ farad, respectively. An example of the AC signal of $I_{in}$ under normal conditions is approximately 2 micro Amps at 10 MHz. An example of a range of the resistance of resistor 102 is approximately 10 kilo-Ohms to approximately 500 kilo-Ohms. The primary function of this circuit 100 is to reach mid-point operating frequencies and then quickly become nonresponsive to fluctuations in the frequencies. Circuit 100 allows a quick recovery to fluctuations in the frequencies such as those caused by thermal asperity.

An example of normal condition for the circuit 100 is approximately 20 milli-volts of input voltage ($V_{in}$) at 10 MHz with an input current ($I_{in}$) of approximately 2 micro Amps. An example of the circuit 100 operating under normal conditions is when $I_{in}<[(V_T)^*(\text{capacitance of capacitor } 104a)^*(2\Pi)^*(\text{frequency of the input signal})]$. Wherein $V_T$ is a threshold voltage of either one of transistors 106a and 106b. Under normal conditions, the function of circuit 100 is to perform a low pass filter function that allows medium frequencies, such as 100 KHz to 10 MHz, to pass through the circuit 100.

FIG. 2A shows the path of the current in circuit 100 during normal conditions. $I_{in}$ flows into the circuit 100 and through resistor 102. The resistor 102 keeps the circuit 100 from oscillating back and forth between a state of the transistors 106a–106b being turned on and off and on again. Most of the current, such as 90% to 99% of $I_{in}$ flows into capacitor 104a, while the remaining current flows through capacitor 104b and into capacitor 104c. Most of the current will flow through capacitor 104a because transistors 106a and 106b are off under normal conditions and capacitor 104a is bigger than capacitor 104b.

In this example, normal conditions may be defined as $I_{in}$ being $<[(V_T)^*(\text{capacitance of capacitor } 104a)^*(2\Pi)^*(\text{frequency of } I_{in})]$. If $V_T$ is 0.4V, and capacitance of capacitor 104a is $4\times10^{-12}$ farad, at a frequency of 10 MHz, an $I_{in}$ of approximately 100 micro-Amps would satisfy the condition of being less than $[(V_T)^*(\text{capacitance of capacitor } 104a)^*(2\Pi)^*(\text{frequency of } I_{in})]$. The $I_{in}$ under normal conditions is not high enough to turn on either transistor 106a or transistor 106b.

Under normal conditions, the circuit 100 performs a low pass filter function that allows medium frequencies, such as 100 KHz to 10 MHz, to pass through the circuit 100. When a signal that is a lower frequency or of higher amplitude or both, such as a thermal asperity, is received, then the conditions are considered not normal. An example of a non-normal condition signal is a signal of approximately 100 KHz and 25 milli-volts. Under these conditions, the difference in voltage between gate to source voltage on transistors 106a–106b will turn on transistor 106b if the voltage difference is positive, and turn on transistor 106a if the voltage difference is negative. The difference in voltage between gate to source voltage on a transistor, such as transistor 106a or 106b, is commonly referred to as a threshold voltage of the transistor. An example of the threshold voltage of transistors 106a and 106b is approximately 500 milli-volts.

The circuit 100 shown in FIG. 2B illustrates the current path when transistor 106a or transistor 106b is turned on. If the voltage difference between the gate and source of a transistor is positive, then transistor 106b turns on. Accordingly, $I_{in}$ flows through transistor 106b and directly into capacitor 104c, bypassing capacitors 104a, 104b and resistor 102. Accordingly, rather than capacitor 106c receiving a very small percentage of the incoming current, such as 1/400 I, capacitor 104c now receives a large portion of the incoming current, such as 50% to 90%. Hence, there is an effective current gain from $I_{in}$ to $V_{out}$ of an increase greater than 100 times than during normal conditions. Accordingly, the low pass pole moves up to pass the signals caused by the thermal asperity. For example, during transient conditions, the low pass filter circuit may also pass signals ranging from 10 MHz to 100 MHz.

Likewise, if the voltage difference between the source and drain of transistors 106a and 106b is negative for an incoming signal that is a transient, such as a thermal asperity, then transistor 106a is turned on. The incoming current then flows through transistor 106a and directly into capacitor 104c, bypassing capacitors 104a, 104b, and resistor 102.

Under non-normal conditions, such as when signals caused by a thermal asperity are received, the function of circuit 100 changes to increase $V_{out}$ from the normal condition $V_{out}$ of approximately one micro volt to approximately twenty-five milli-volt.

Transistors 106a and 106b may turn on when $V_{in}=2V_T$, wherein $V_T$ is the threshold voltage of either transistor 106a or transistor 106b. If $I_{in}$ is operating at a voltage where both transistor 106a and transistor 106b are both off, then the $V_{in}$ may remain unknown since $I_{in}$ would be under normal conditions and $V_{out}$ would also remain under normal conditions, such as 1 micro volt. If, however, either transistor 106a or transistor 106b is on, then $V_{out}$ is adjusted and transistors 106a and 106b are turned off. Transistor 106a is turned off when the absolute value of the gate to source voltage of transistor 106a is less than $V_T$, such as less than approximately 500 milli-volts. Likewise, transistor 106b is turned off when the absolute value of the gate to source voltage of transistor 106b is less than $V_T$.

For example, if transistor 106b is on, then $V_{out}$ is pulled down to the same value as the received signal, such as a change of voltage of approximately 25 milli-volts. The differential amplifier 202 of FIG. 1 then lowers its high pass pole, such as by one hundred times its previous pole. When $I_{in}$ flows through capacitor 104c, the output voltage of circuit 100 is lowered, which in turn moves the voltage at the differential amplifier 202 to a nominal voltage, such as the reference voltage. The change in voltage at differential amplifier 202 down to the nominal voltage then causes the current at transconductor 204 to become zero and the charge at low pass bleeds into capacitor 104a sufficient to shut off transistor 106b. Likewise, if transistor 106a is on, then $V_{out}$ is pulled up and the feedback loop of FIG. 1 pulls down $I_{in}$ and turns off transistor 106a.

According to an embodiment of the present invention, $V_{in}$ does not need to be exactly determined. If the $V_{in}$ is within an operating range, then the response of the circuit 100 is within desired specification, and if the $V_{in}$ is outside of the operating range, then circuit 100 pulls the $V_{in}$ back into operating range.

Figure 3:
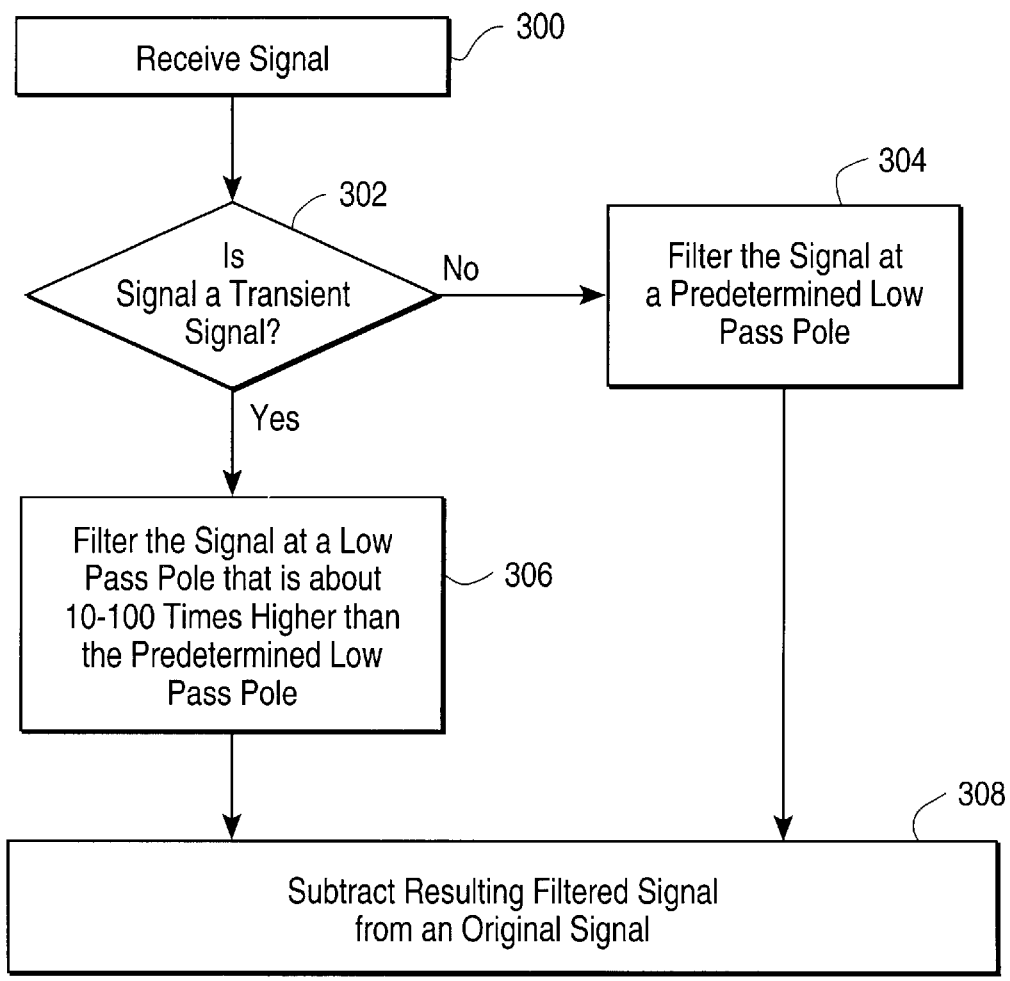
FIG. 3 is a flow diagram of a method according to an embodiment of the present invention for filtering a signal in a preamplifier.

FIG. 3 is a flow diagram of a method according to an embodiment of the present invention for filtering a signal in a preamplifier. A first signal is provided (step 300), and it is determined whether the signal is a transient signal (step 302). A transient signal is expected to have low frequencies with a direct current (DC) component. If the signal is not a transient signal, then the signal is filtered at a predetermined low pass pole to produce a first range of frequencies (step 304). A non-transient signal is expected to have alternating pulses (AC) returning to a zero base line, free of DC. If, however, the signal is a transient signal, then the signal is filtered at a low pass pole that is significantly higher, such as 10 to 100 times higher, than the predetermined low pass pole to produce a second range of frequencies if the signal is a transient signal (step 306). The resulting filtered signal is then subtracted from an original signal (such as signal 206).

Although the present invention has been described in accordance with the embodiment shown, one of ordinary skill in the art will readily recognize that there could be variations to the embodiment and these variations would be within the spirit and scope of the present invention. Accordingly, many modifications may be made by one of ordinary skill in the art without departing from the spirit and scope of the appended claims.

What is claimed is:

1. A system of filtering a signal in a preamplifier, comprising:

a filter that passes a first range of signals during a first input signal condition and passes a second range of signals during a second input signal condition, wherein the first or second input signal condition is determined based on the signal, wherein the filter produces a first signal, and wherein the second input signal condition includes a transient; and a differential amplifier coupled to the filter, wherein the differential amplifier subtracts the first signal from a second signal.

2. The system of claim 1, wherein the second signal includes the transient.

3. The system of claim 1, wherein the filter includes a first capacitor and a second capacitor such that a majority of a current flows through the first capacitor during the first input signal condition and through the second capacitor during the second input signal condition.

4. The system of claim 3, further comprising a first transistor that may turn on during the second input signal condition.

5. The system of claim 4, further comprising a second transistor that may turn on during the second input signal condition.

6. The system of claim 3, wherein the filter includes a resistor coupled with the first capacitor.

7. The system of claim 3, further comprising a third capacitor coupled to the first capacitor.

8. The system of claim 1, wherein the first range of signals includes 100 KHz to 10 MHz.

9. The system of claim 1, wherein the second range of signals includes 10 MHz to 100 MHz.

10. The system of claim 1, wherein the transient includes a signal produced by a thermal asperity.

11. A method for filtering a signal in a preamplifier, the signal hereinafter referred to as the signal, the method comprising:

providing a first signal;

determining whether the signal is a transient signal;

filtering the signal at a first range of frequencies if the signal is not a transient signal, resulting in a first filtered signal;

filtering the signal at a second range of frequencies if the signal is a transient signal, resulting in a second filtered signal; and subtracting one of the first filtered signal and the second filtered signal from a second signal.

12. The method of claim 11, wherein the second range of frequencies includes 10 MHz to 100 MHz.

13. The method of claim 11, wherein the transient signal includes a signal produced by a thermal asperity.

14. The method of claim 11 wherein the step of filtering the signal at the first range of frequencies includes routing a majority of a current through a first capacitor, and the step of filtering the signal at the second range of frequencies includes routing a majority of the current through a second capacitor.

15. The method of claim 11 wherein the transient signal includes a signal produced by write to read switching.

16. The method of claim 11 wherein the transient signal includes a signal produced by power switching.

17. The method of claim 11 wherein the step of filtering the signal at the first range of frequencies includes low-pass filtering at the first range of frequencies, and the step of filtering the signal at the second range of frequencies includes low-pass filtering at the second range of frequencies.

18. The method of claim 17 wherein the second signal is the signal, and the subtracting step results in a high-pass filtered signal.

19. The method of claim 11 wherein the first range of frequencies includes 100 KHz to 10 MHz.

20. The method of claim 19 wherein the second range of frequencies includes 10 MHz to 100 MHz.

* * * * *